(12) United States Patent
Sel et al.

(10) Patent No.: US 7,132,728 B2
(45) Date of Patent: Nov. 7, 2006

(54) NON-VOLATILE MEMORY DEVICES INCLUDING FUSE COVERED FIELD REGIONS

(75) Inventors: Jong-Sun Sel, Seoul (KR); Sung-Nam Chang, Seoul (KR); Dae-Woong Kang, Seoul (KR); Bong-Tae Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/020,925

(22) Filed: Dec. 22, 2004

(65) Prior Publication Data

US 2005/0139953 A1   Jun. 30, 2005

(30) Foreign Application Priority Data

Dec. 24, 2003   (KR) .................... 10-2003-0096767

(51) Int. Cl.
*H01L 29/00* (2006.01)
(52) U.S. Cl. ...................... 257/528; 257/529

(58) Field of Classification Search ........ 257/528–543, 257/314–324
See application file for complete search history.

(56) References Cited

U.S. PATENT DOCUMENTS

| 6,518,642 | B1 * | 2/2003 | Kim et al. ................. 257/528 |
| 6,531,757 | B1 | 3/2003 | Shiratake ................... 257/529 |
| 6,972,474 | B1 * | 12/2005 | Hashimoto ................ 257/529 |

FOREIGN PATENT DOCUMENTS

KR        2001-0068736        7/2001

* cited by examiner

*Primary Examiner*—Cuong Nguyen
(74) *Attorney, Agent, or Firm*—Myers Bigel Sibley & Sajovec, PA

(57) ABSTRACT

A non-volatile device includes a semiconductor substrate having a fuse window region. At least one fuse crosses the fuse window region. Field regions are arranged outside of the fuse window region and arranged under end portions of the at least one fuse. An isolation layer is configured to isolate the field regions. A fuse insulating layer is interposed between the at least one fuse and the field regions.

10 Claims, 9 Drawing Sheets

NON-VOLATILE MEMORY DEVICES INCLUDING FUSE COVERED FIELD REGIONS

RELATED APPLICATIONS

This application claims the benefit of and priority to Korean Patent Application No. 2003-96767, filed Dec. 24, 2003, the disclosure of which is hereby incorporated herein by reference.

FIELD OF THE INVENTION

The present invention relates generally to integrated circuit devices and methods of operating the same and, more particularly, to non-volatile memory devices and methods of operating the same.

BACKGROUND OF THE INVENTION

A fuse has been used for providing access to redundant cells in a semiconductor memory device. Using the fuse can increase the yield of the semiconductor memory device. In addition, a cell transistor in a non-volatile memory device typically has a dual gate electrode comprising a floating gate electrode and a control gate electrode. Therefore, when fabricating a non-volatile memory device, the fuse and the control gate electrode may be formed using the same layer.

In forming the fuse, a trench may be formed by patterning a predetermined region of a semiconductor substrate, and then an insulating layer may be formed on the semiconductor substrate in which the trench has been formed. Subsequently, the insulating layer may be planarized by a chemical mechanical polishing (CMP) process so that an isolation layer may be formed in the trench. After a control gate conductive layer is formed on the isolation layer, the fuse may be obtained by patterning the control gate conductive layer. Because patterning the control gate conductive layer forms the fuse, the fuse may be formed during formation of the control gate. Therefore, additional processing may be unnecessary to form the fuse.

Unfortunately, when the CMP process is carried out, a dishing (that is, a dented shape) may occur in the isolation layer. Particularly, the dishing may be more severe in an isolation layer filling a trench having a relatively wide width. The wide trench, however, may be required so as to form a fuse box including a plurality of fuses.

The dishing may cause polishing damage at active regions arranged near the fuses when the CMP process is carried out. Particularly, the fuses may be electrically connected to sensing transistors. Because the sensing transistors may be closely arranged with the fuses, the sensing transistors may be damaged during the CMP process.

A method for preventing dishing is disclosed in U.S. Pat. No. 6,531,757 issued to Shiratake entitled "Semiconductor device fuse box with fuses of uniform depth." According to U.S. Pat. No. 6,531,757, a trench is formed in a semiconductor substrate comprising silicon. Subsequently, an oxide layer is formed on the semiconductor substrate with the trench, and then the oxide layer is planarized by a CMP process. As a result, isolation layers filled with the oxide layer in the trench are formed. The isolation layers are formed adjacent to the field regions constituting semiconductor regions. By decreasing the area of the isolation layer, dishing can be suppressed. The fuses are formed on the isolation layer so as to be arranged thereon. An oxide layer deposited on the isolation layer may cover the fuses.

According to the above-described method, the fuses may be formed on the same level as a control gate because dishing is reduced. The formation of the fuses as described in U.S. Pat. No. 6,531,757 may have some disadvantages, however. Fuse window regions expose the fuses and the surface of the field regions simultaneously. When a laser beam blows the fuses, the laser beam may irregularly reflect from the field regions. It may be difficult to blow the fuses because of the irregular reflection of the laser beam. Also, the fuses blown by the laser beam may be electrically connected to the field regions arranged near the blown fuses. As a result, the blown fuses may generate a short circuit. In addition, the field regions exposed while the fuses are formed by patterning the control gate conductive layer may be damaged by etching. As a result, pitting may occur in the field regions.

Thus, the method described in U.S. Pat. No. 6,531,757 may be difficult to apply to non-volatile memory device processing for forming a fuse and a control gate electrode by patterning the control gate conductive layer.

SUMMARY OF THE INVENTION

According to some embodiments of the present invention, a non-volatile device includes a semiconductor substrate having a fuse window region. At least one fuse crosses the fuse window region. Field regions are arranged outside of the fuse window region and arranged under end portions of the at least one fuse. An isolation layer is configured to isolate the field regions. A fuse insulating layer is interposed between the at least one fuse and the field regions.

In other embodiments of the present invention, the at least one fuse comprises a polysilicon layer.

In still other embodiments of the present invention, the at least one fuse further comprises a silicide layer deposited on the polysilicon layer.

In still other embodiments of the present invention, the fuse insulating layer comprises a stacked layer of a silicon oxide layer, a silicon nitride layer and a silicon oxide layer.

In still other embodiments of the present invention, each of the field regions is arranged entirely under the at least one fuse.

In further embodiments of the present invention, a non-volatile memory device includes a semiconductor substrate having a fuse window region. At least one fuse crosses the fuse window region. Semiconductor regions are arranged outside of the fuse window region and arranged under both end portions of the at least one fuse. A fuse insulating layer is interposed between the at least one fuse and the field regions. Transistors are respectively connected electrically to both end portions of the at least one fuse, each transistor respectively comprising an active region, a gate electrode crossing the active region, and a gate insulating layer interposed between the active region and the gate electrode. An isolation layer is configured to isolate each of the active regions and the field regions.

In still further embodiments of the present invention, the gate electrode comprises a floating gate electrode and a control gate electrode deposited on the floating gate electrode.

In still further embodiments of the present invention, the gate electrode further comprises an interlayer insulating layer interposed between the floating gate electrode and the control gate electrode.

In still further embodiments of the present invention, the fuse comprises the same material as the control gate electrode, and the fuse insulating layer comprises the same material as the interlayer insulating layer.

In still further embodiments of the present invention, the field regions are arranged entirely under the at least one fuse.

In other embodiments of the present invention, a non-volatile memory device is fabricated by forming a fuse window region in a semiconductor substrate. The semiconductor substrate is patterned to form a trench that defines field regions and an isolation region, the field regions facing each other outside the fuse window region. An isolation layer is formed that fills the trench. An interlayer insulating layer and a control gate conductive layer are sequentially formed on the semiconductor substrate and the isolation layer. At least one fuse is formed that crosses the fuse window region by patterning the control gate conductive layer, the at least one fuse covering upper surfaces of the field regions.

In still other embodiments of the present invention, the trench further defines active regions.

In still other embodiments of the present invention, before sequentially forming the interlayer insulating layer and the control gate conductive layer the following operations are performed: a gate insulating layer and a floating gate conductive layer are sequentially formed on the semiconductor substrate. The floating gate conductive layer is patterned, thereby forming a patterned floating gate conductive layer having an opening that exposes the fuse window region, the patterned floating gate conductive layer covering the upper surfaces of the active regions.

In still other embodiments of the present invention, gate electrodes are formed that cross the active regions by sequentially patterning the control gate conductive layer, the interlayer insulating layer, and the patterned floating gate conductive layer formed on the active regions while forming the at least one fuse by patterning the control gate conductive layer.

In still other embodiments of the present invention, the opening is extended so as to expose a predetermined region comprising the field regions and the at least one fuse is formed on the predetermined region.

In still other embodiments of the present invention, gate electrodes are formed that cross the active regions by sequentially patterning the control gate conductive layer, the interlayer insulating layer, and the patterned floating gate conductive layer formed on the active regions while forming the at least one fuse by patterning the control gate conductive layer.

In still other embodiments of the present invention, forming the at least one fuse by patterning the control gate conductive layer comprises forming gate electrodes crossing the active region by sequentially patterning the control gate conductive layer, the interlayer insulating layer, and the patterned floating gate conductive layer such that the control gate conductive layer covering upper surfaces of the fuse window region and the field regions remains. The remaining control gate conductive layer is patterned.

In still other embodiments of the present invention, portions of the patterned floating gate conductive layer are separated to cover upper surfaces of the field regions, and the at least one fuse covers a portion of the patterned floating gate conductive layer which covers the upper surfaces of the field regions.

In still other embodiments of the present invention, the interlayer insulating layer formed on the patterned floating gate conductive layer is removed before the control gate conductive layer is formed. Gate electrodes crossing the active regions are formed by sequentially patterning the control gate conductive layer, the interlayer insulating layer, and the patterned floating gate conductive layer formed on the active regions while forming the at least one fuse by patterning the control gate conductive layer.

In still other embodiments of the present invention, the opening is extended so as to expose a predetermined region comprising the field regions.

BRIEF DESCRIPTION OF THE DRAWINGS

Other features of the present invention will be more readily understood from the following detailed description of specific embodiments thereof when read in conjunction with the accompanying drawings, in which:

FIGS. 2A through 9A are cross-sectional views taken along line I—I of FIG. 1 that illustrate methods of fabricating non-volatile memory devices in accordance with some embodiments of the present invention; and FIGS. 2B through 9B are cross-sectional views taken along line II—II of FIG. 1 that illustrate methods of fabricating non-volatile memory devices in accordance with some embodiments of the present invention.

DETAILED DESCRIPTION OF PREFERRED EMBODIMENTS

Figure 1:
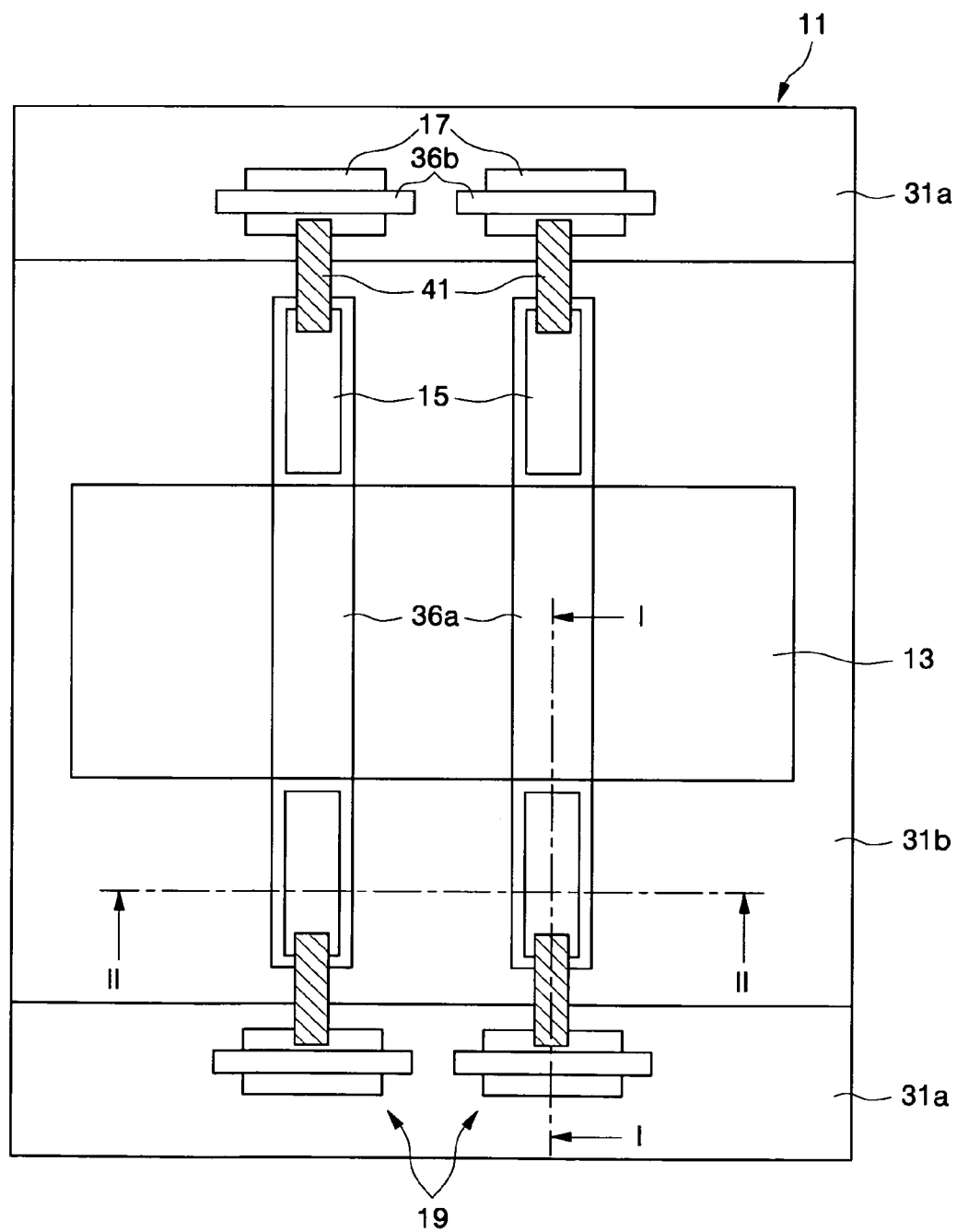
FIG. 1 is a plan view that illustrates non-volatile memory devices in accordance with some embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout the description.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to another elements as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to. cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view that illustrates non-volatile memory devices in accordance with some embodiments of the present invention; FIGS. 2A through 9A are cross-sectional views taken along line I—I of FIG. 1 that illustrate methods of fabricating non-volatile memory devices in accordance with some embodiments of the present invention; and FIGS. 2B through 9B are cross-sectional views taken along line II—II of FIG. 1 that illustrate methods of fabricating non-volatile memory devices in accordance with some embodiments of the present invention.

Figure 9A:
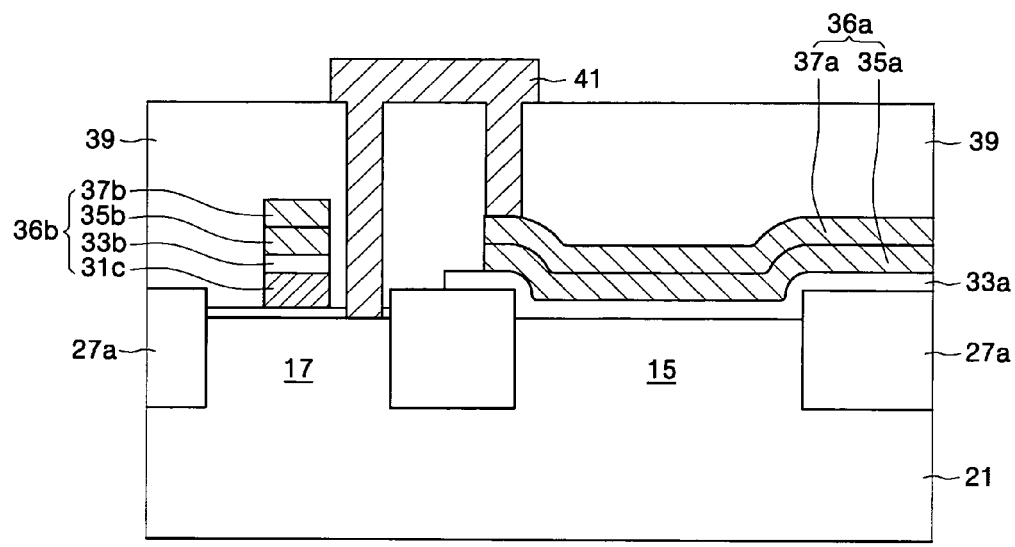
Figure 9B:
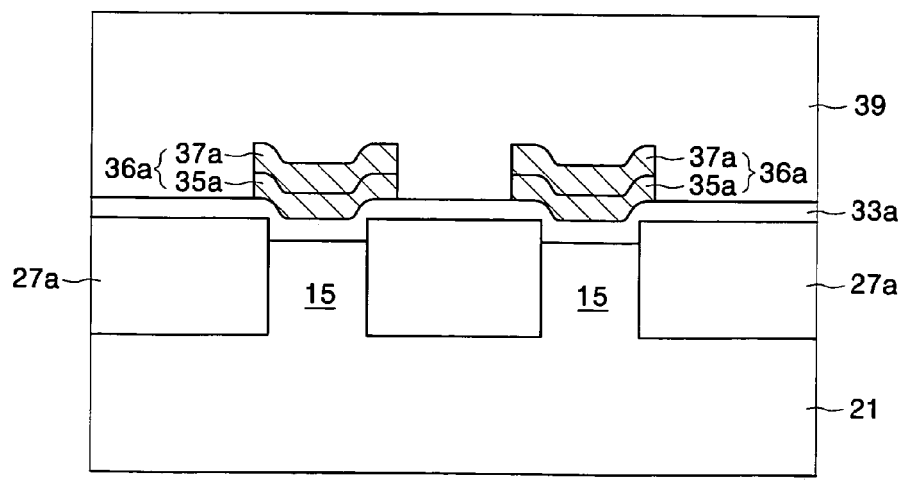

As shown in FIG. 1, FIG. 9A, and FIG. 9B, fuses 36a crossing a fuse window region 13 are arranged on a semiconductor substrate 21 having a fuse window region 13. The fuse window region 13 is formed in an insulating layer formed on the fuses 36a so that the fuses 36a may be easily blown by a laser beam. The fuse window region 13 represents a region of the semiconductor substrate 21 under the fuse window.

In a non-volatile memory device with a dual gate electrode, the fuses 36a are formed of the same material as a control gate electrode. The fuses 36a may be formed using a polysilicon (poly-Si) layer 35a, or a stacked layer of the polysislcon layer 35a and a silicide layer 37a. The silicide layer 37a may be a tungsten silicide layer (WSix), a cobalt silicide layer (CoSix), and/or a nickel silicide layer (NiSi). The fuses 36a are arranged on a predetermined region of the semiconductor substrate 21. Generally, the predetermined region represents a fuse box 11.

Also, field regions 15 are arranged outside of the fuse window region 13. The field regions 15 include semiconductor regions of the semiconductor substrate 21. The field regions 15 are arranged under the end portions of the fuses 36a that are arranged outside of the fuse window region 13. In addition, each of the field regions 15 may be arranged only under the fuses 36a. That is, the field regions 15 are limited to being under the fuses 36a. As a result, a pitting may not occur in the field regions 15 while the fuses 36a are formed. Each end portion of the fuses 36a may be arranged on the plurality of field regions 15 spaced apart from one another, respectively.

An isolation layer 27a isolates the field regions 15. The isolation layer 27a may be a silicon oxide layer. Also, a fuse insulating layer 33a is interposed between the fuses 36a and the field regions 15. The fuse insulating layer 33a may be formed using the same material as an interlayer insulating layer that is generally used in a non-volatile memory device with a dual gate electrode. The fuse insulating layer 33a may comprise a silicon oxide layer ($SiO_2$), or a stacked layer of a silicon oxide layer, a silicon nitride layer (SiN), and/or a silicon oxide layer.

In addition, transistors 19 connected electrically to the fuses 36a are arranged on the semiconductor substrate 21. Specially, the transistors 19 are arranged in the fuse box 11 of the semiconductor substrate 21. Each of the transistors 19 includes an active region 17, a gate electrode 36b, and a gate insulating layer 29 interposed between the active region 17 and the gate electrode 36b. The active region 17 and the field regions 15 are isolated by the isolation layer 27a. Also, the gate electrode 36b includes a floating gate electrode 31c and control gate electrodes 35b, 37b deposited on the floating gate electrode 31c. An interlayer insulating layer 33b is interposed between the control gate electrodes 35b, 37b and the floating gate electrode 31c.

The fuses 36a may be formed using the same material as the control gate electrode 35b, 37b, and the fuse insulating layer 33a may be formed using the same material as the interlayer insulating layer 33b.

The transistors 19 and the fuses 36a are electrically connected through a bit line 41. An upper insulating layer 39 insulates the bit line 41 and the gate electrode 36b, and the bit line 41 is electrically connected to the transistors 19 and the fuses 36a through a contact plug.

A non-volatile memory device, according to some embodiments of the invention, may be designed so that the field regions 15 are disposed nearby the active regions 17 of the transistors 19. The field regions 15 reduce polishing damage to the active regions 17 while the isolation layer 27a is formed. The field regions 15 are arranged outside of the fuse window regions 13. As a result, when a laser beam blows the fuses, an irregular reflection of the laser beam may not be generated. In addition, the blown fuses 36a may not generate a short circuit in the field regions 15, and a pitting may not occur in the field regions 15 because the field regions 15 are arranged only under the fuses 36a.

Figure 2A:
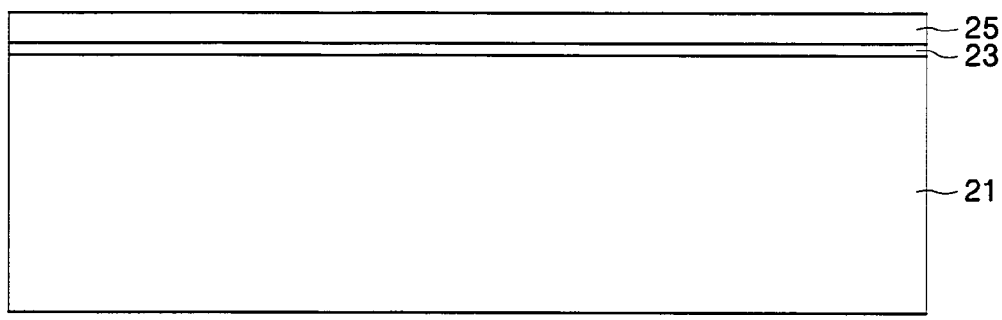
Figure 2B:
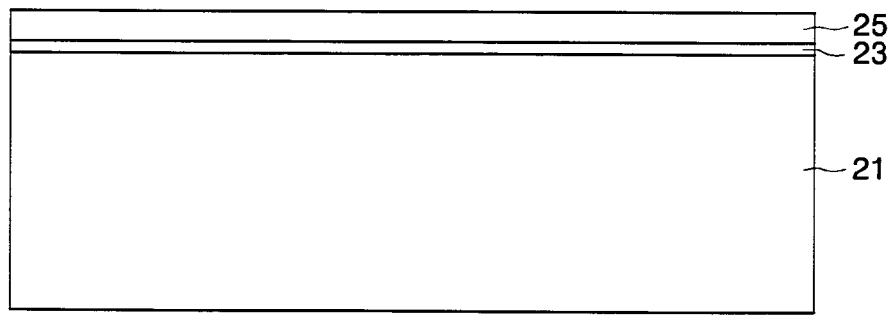

Method of fabricating non-volatile memory device, in accordance with some embodiments of the present invention, will now be described. As shown in FIG. 1, FIG. 2A, and FIG. 2B, a pad insulating layer 23 and a polishing stop layer 25 are formed on a semiconductor substrate 21 having a fuse window region 13. The polishing stop layer 25 may be formed using a silicon nitride layer (SiN). The pad insulating layer 23 may reduce stress generated between the semiconductor substrate 21 and the polishing stop layer 25. The pad insulating layer 23 may be formed using a silicon oxide layer.

A polysilicon layer (not shown) may be formed between the pad insulating layer 23 and the polishing stop layer 25. In the case, the pad insulating layer 23 may be a gate insulating layer. A hard mask layer (not shown) may be further formed on the polishing stop layer 25. The hard mask layer may be formed using a silicon oxide layer.

Figure 3A:
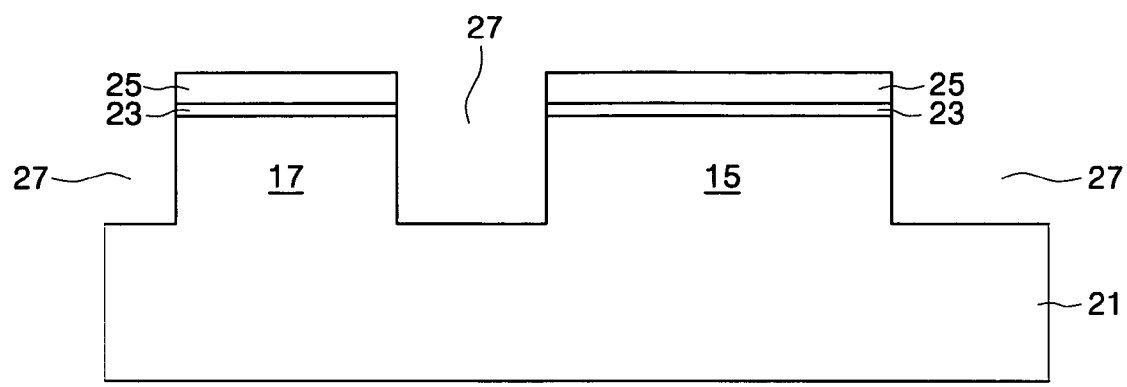
Figure 3B:
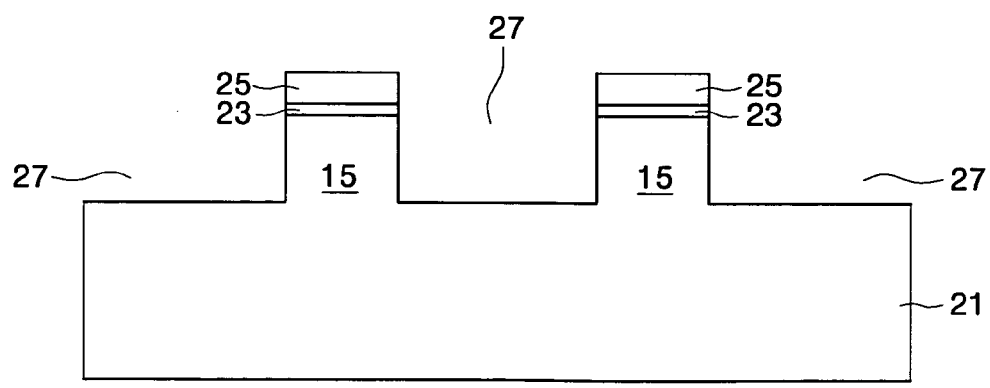

As shown in FIG. 1, FIG. 3A, and FIG. 3B, a trench 27 is formed by sequentially patterning the polishing stop layer 25, the pad insulating layer 23, and the semiconductor substrate 21. Regions formed with the trench 27 are isolation regions. Therefore, the trench 27 defines the field regions 15 and the active regions 17. The field regions 15 and the active regions 17 comprise the semiconductor region of the semiconductor substrate 21. The field regions 15 are disposed opposite to the fuse window region 13. In addition, the active regions 17 are formed near the field regions 15. The trench 27 is formed on the overall region of the fuse box 11 except the field regions 15 and the active regions 17.

Figure 4A:
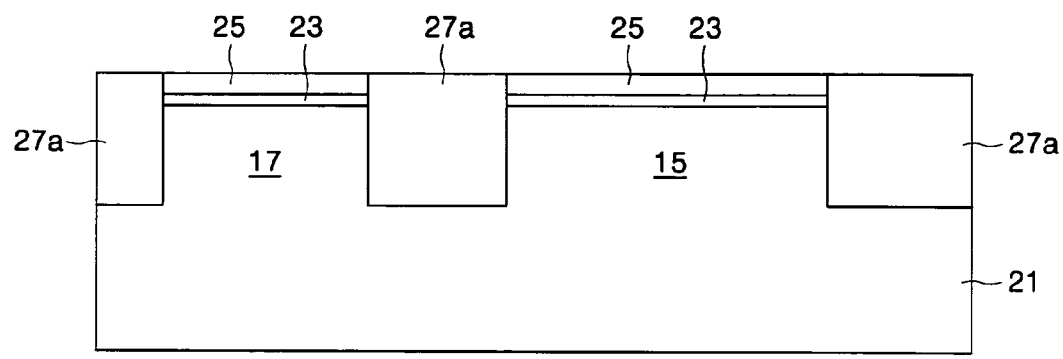
Figure 4B:
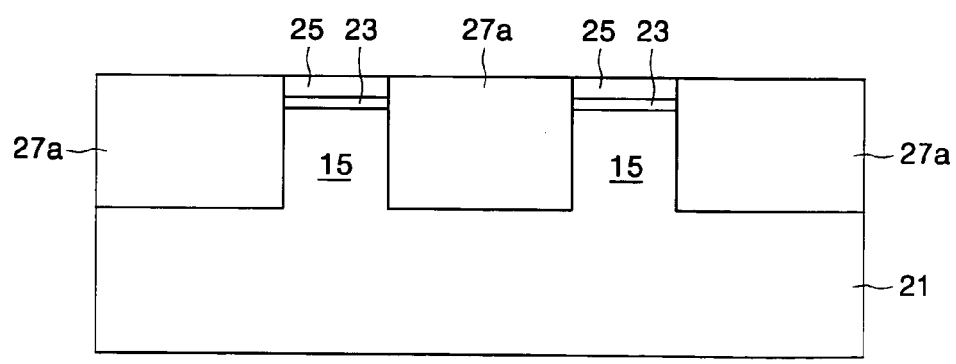

As shown in FIG. 1, FIG. 4A, and FIG. 4B, an insulating layer that fills the trench 27 is formed on the semiconductor substrate formed with the trench 27. The insulating layer may be formed by high density plasma chemical vapor deposition (HDP-CVD). Also, a thermal oxide layer may be formed on a sidewall of the trench 27 before the insulating layer is formed. The thermal oxide layer may be formed so as to recover defects generated on the sidewall of the trench 27 when the trench 27 is formed.

The insulating layer is planarized through CMP until the surface of the polishing stop layer 27 is exposed. As a result, an isolation layer 27a that fills the trench 27 is obtained. At this time, a recess is generated in the polishing stop layer 25 while the CMP process is performed. A dishing occurs in the isolation layer 27; however, the field regions 15 reduce and/or prevent polishing damage from occurring in the active regions 17.

Figure 5A:
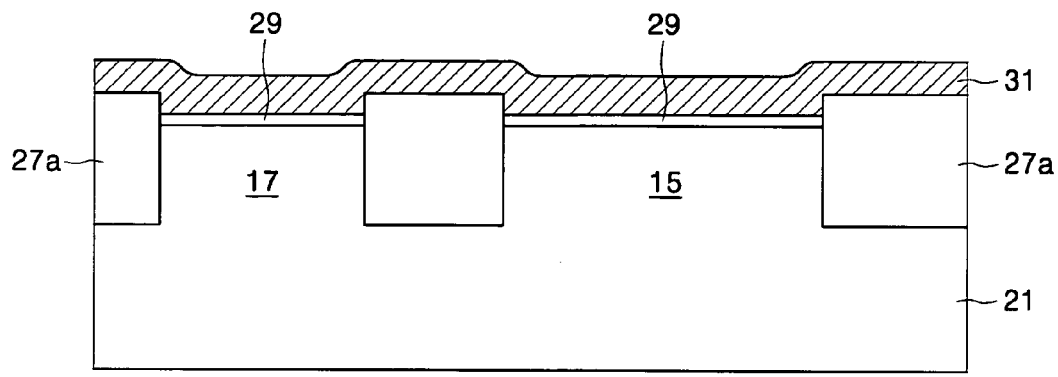
Figure 5B:
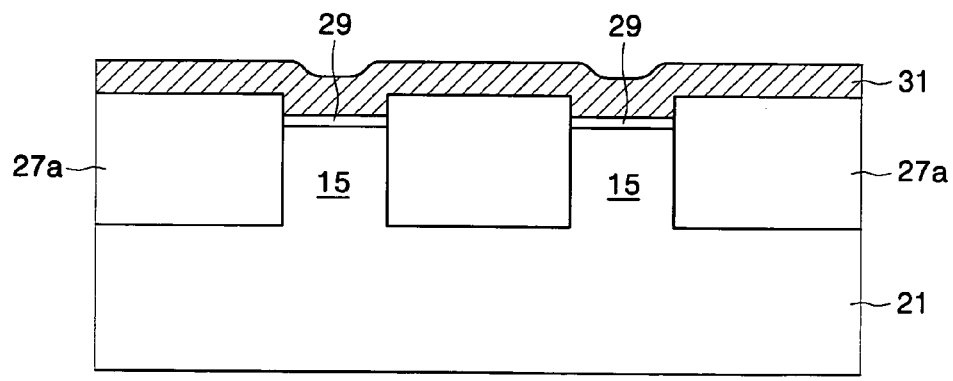

As shown in FIG. 1, FIG. 5A, and FIG. 5B, the recessed polishing stop layer 25 is removed. The polishing stop layer 25 may be selectively removed by a wet etching process. In addition, the pad insulating layer 23 is removed. As a result, upper surfaces of the active regions 17 and the field regions 15 are exposed.

A gate insulating layer 29 and a floating gate conductive layer 31 are formed on the semiconductor substrate from which the pad insulating layer 23 has been removed. The gate insulating layer 29 may be formed using a thermal oxide layer. The floating gate conductive layer 31 may be formed using a polysilicon layer.

When a polysilicon layer is formed between the pad insulating layer 23 and the polishing stop layer 25, the polysilicon layer and the pad insulating layer 23 remain and the polishing stop layer 25 is selectively removed. Subsequently, the floating gate conductive layer 31 is formed. Here, the pad insulating layer 23 is formed as the gate insulating layer 29.

Figure 6A:
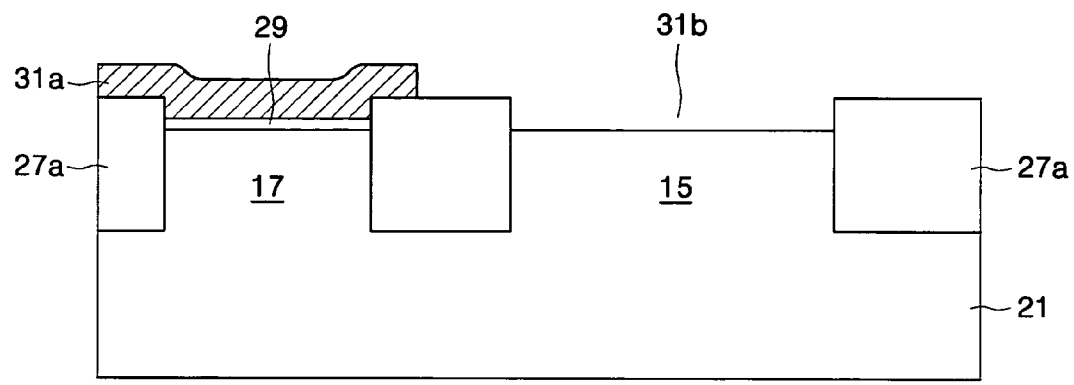
Figure 6B:
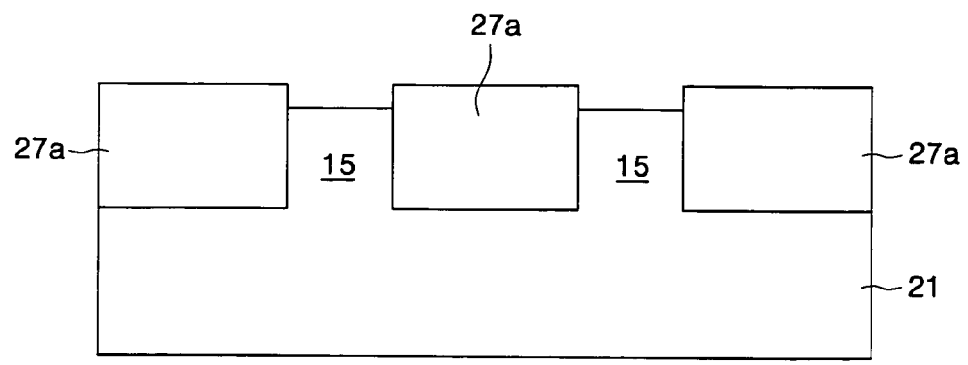

As shown in FIG. 1, FIG. 6A, and FIG. 6B, the floating gate conductive layer 31 is patterned to form a patterned floating gate conductive layer 31a which has an opening 31b exposing an upper surface of the fuse window region 13. The patterned floating gate conductive layer 31a covers upper surfaces of the active regions 17.

The opening 31b, as shown FIG. 1, may be extended so as to expose an upper surface of a predetermined region including the field regions 15. The gate insulating layer 29 may be removed while the floating gate conductive layer 31 is patterned. As a result, the upper surfaces of the field regions 15 are exposed through the opening 31b.

In other embodiments, the opening 31b, as above-mentioned, may be extended so as to expose the upper surface of a predetermined region including the field regions 15, and some portions of the patterned floating gate conductive layer 31 a may cover each of the field regions 15. That is, the floating gate conductive layer 31 may remain on the field regions 15, but each of the portions of the patterned floating gate conductive layer 31a covering the field regions 15 is spaced apart from one another. Therefore, the field regions 15 are not exposed while the patterned floating gate conductive layer 31a is formed. As a result, a pitting may not occur in the field regions 15 while the patterned floating gate conductive layer 31a is patterned.

Figure 7A:
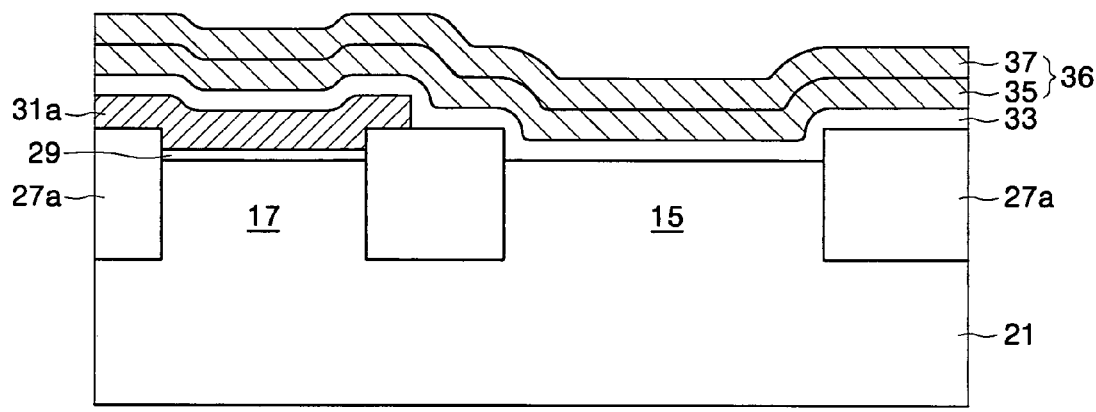
Figure 7B:
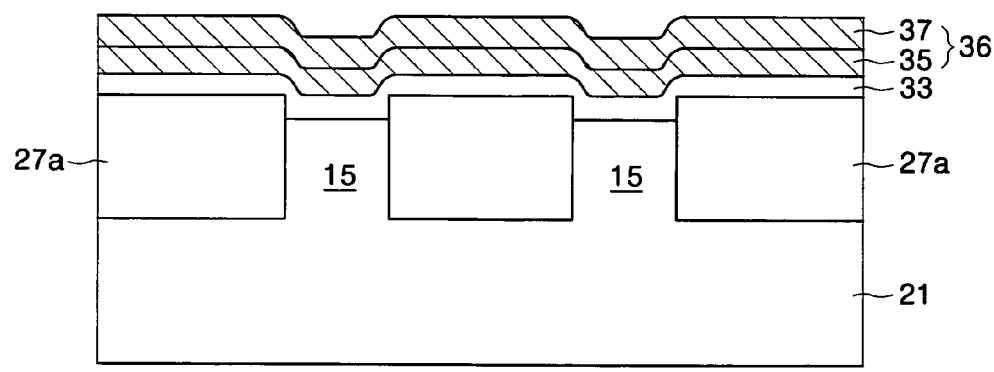

As shown in FIG. 1, FIG. 7A, and FIG. 7B, an interlayer insulating layer 33 and a control gate conductive layer 36 are formed on the semiconductor substrate with the patterned floating gate conductive layer 31a. The interlayer insulating layer 33 may be formed using a silicon oxide layer or a stacked layer of a silicon oxide layer, a silicon nitride layer, and/or a silicon oxide layer. The control gate conductive layer 36 may be formed using a polysilicon layer or a stacked layer of a polysilicon layer 35 and/or a silicide layer 37. The silicide layer 37 may be a tungsten silicide layer, a cobalt silicide layer, and/or a nickel silicide layer.

The interlayer insulating layer 33 formed on the active regions 17 is selectively removed before the control gate conductive layer 36 is formed. Therefore, the patterned floating gate conductive layer 31a directly contacts the control gate conductive layer 36 over the upper surfaces of the active regions 17.

Figure 8A:
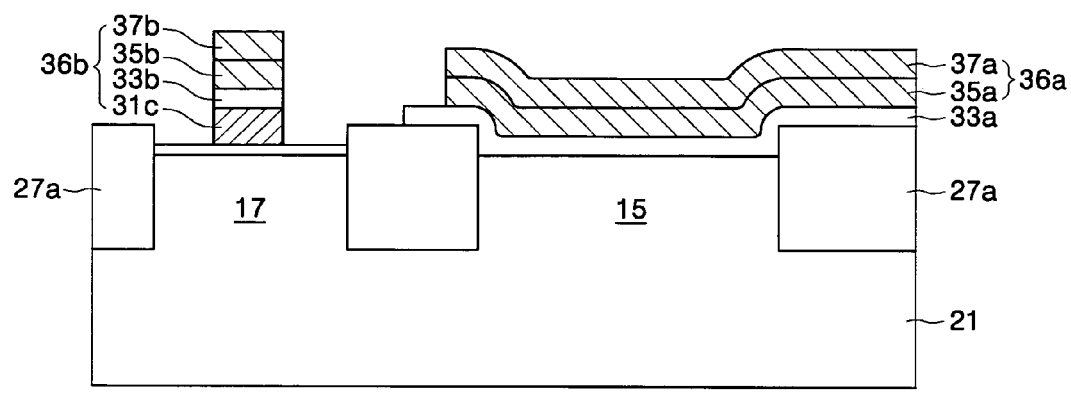
Figure 8B:
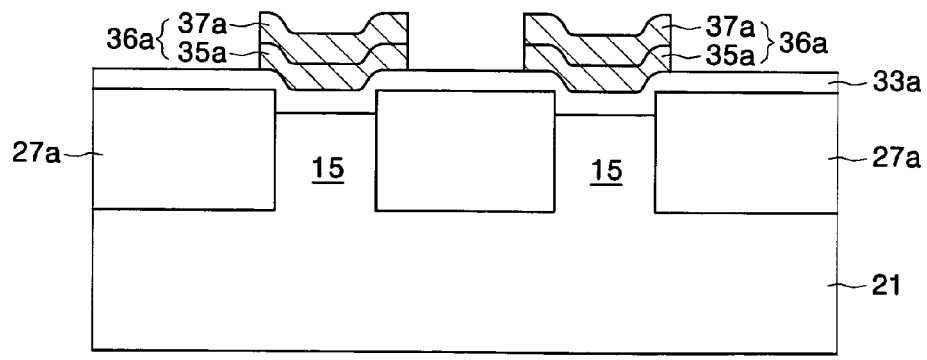

As shown in FIG. 1, FIG. 8A, and FIG. 8B, the gate electrodes 36b are formed on the active regions 17 by sequentially patterning the control gate conductive layer 36, the interlayer insulating layer 33, and the patterned floating gate conductive layer 31a. Each of the gate electrodes 36b may include a floating gate electrode 3 1c, a patterned interlayer insulating layer 33b, and control gate electrodes 35b and 37b.

The fuses 36a crossing the fuse window region 13 may be formed by sequentially patterning the control gate conductive layer 36 and the interlayer insulating layer 33 while the gate electrode 36b is formed. The fuses 36a may be formed using a stacked layer of the polysilicon layer 35a and the silicide layer 37a. Also, the fuses 36a are arranged on the field regions 15 and the fuse insulating layer 33a is formed under the fuses 36a.

In other embodiments, the fuses 36a are obtained by patterning the control gate conductive layer 36 after forming the gate electrodes 36b. The interlayer insulating layer 33 may partially remain on the isolation layer 27a. Therefore, the fuses 36a are formed while the interlayer insulating layer 33b formed on the floating gate electrode 31c is exposed by etching predetermined regions of the control gate electrodes 35b and 37b. As a result, etching damage of the isolation layer 27a may be reduced. Also, the field regions 15 are not exposed while forming the fuses 36a because the field regions 15 are arranged under the fuses 36a. Therefore, pitting may be reduced or does not occur in the field regions 15. Impurities are then ion-implanted into the active regions 17 using the gate electrodes 36b as an ion implantation mask so that source/drain regions (not shown) are formed.

As shown in FIG. 1, FIG. 9A, and FIG. 9B, an upper insulating layer 39 is formed on the semiconductor substrate with the fuses 36a, and then the upper insulating layer 39 is patterned to form contact holes exposing the active regions 17 and the fuses 36a. Conductive materials are then filled in the contact holes to form contact plugs and a bit line 41 is formed to electrically connect with the contact plugs. The fuses 36a are electrically connected to the active regions 17 through the bit line 41 and the contact plugs.

Thus, according to some embodiments of the present invention, a non-volatile memory device may be formed while reducing polishing damage in the active region and pitting in the field regions. Also, the non-volatile memory device may be less susceptible to the generation of a short circuit resulting from fuses blown by the laser beam and an irregular reflection of the laser beam.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A non-volatile memory device, comprising:
   a semiconductor substrate having a fuse window region;
   at least one fuse crossing the fuse window region;
   field regions arranged outside of the fuse window region and arranged under end portions of the at least one fuse;
   an isolation layer configured to isolate the field regions; and
   a fuse insulating layer interposed between the at least one fuse and the field regions.

2. The non-volatile memory device as claimed in claim 1, wherein the at least one fuse comprises a polysilicon layer.

3. The non-volatile memory device as claimed in claim 2, wherein the at least one fuse further comprises a silicide layer deposited on the polysilicon layer.

4. The non-volatile memory device as claimed in claim 3, wherein the fuse insulating layer comprises a stacked layer of a silicon oxide layer, a silicon nitride layer and a silicon oxide layer.

5. The non-volatile memory device as claimed in claim 2, wherein each of the field regions is arranged entirely under the at least one fuse.

6. A non-volatile memory device, comprising:
   a semiconductor substrate having a fuse window region;
   at least one fuse crossing the fuse window region;
   semiconductor regions arranged outside of the fuse window region and arranged under both end portions of the at least one fuse;
   a fuse insulating layer interposed between the at least one fuse and the field regions;
   transistors respectively connected electrically to both end portions of the at least one fuse, each transistor respectively comprising an active region, a gate electrode crossing the active region, and a gate insulating layer interposed between the active region and the gate electrode; and
   an isolation layer configured to isolate each of the active regions and the field regions.

7. The non-volatile memory device as claimed in claim 6, wherein the gate electrode comprises a floating gate electrode and a control gate electrode deposited on the floating gate electrode.

8. The non-volatile memory device as claimed in claim 7, wherein the gate electrode further comprises an interlayer insulating layer interposed between the floating gate electrode and the control gate electrode.

9. The non-volatile memory device as claimed in claim 8, wherein the fuse comprises the same material as the control gate electrode, and the fuse insulating layer comprises the same material as the interlayer insulating layer.

10. The non-volatile memory device as claimed in claim 9, wherein the field regions are arranged entirely under the at least one fuse.

* * * * *